US008106689B2

(12) United States Patent
Rho

(10) Patent No.: US 8,106,689 B2
(45) Date of Patent: Jan. 31, 2012

(54) CIRCUIT FOR GENERATING POWER-UP SIGNAL OF SEMICONDUCTOR MEMORY APPARATUS

(75) Inventor: Kwang-Myoung Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/116,194

(22) Filed: May 26, 2011

(65) Prior Publication Data

US 2011/0221484 A1 Sep. 15, 2011

Related U.S. Application Data

(62) Division of application No. 12/494,942, filed on Jun. 30, 2009, now Pat. No. 7,969,212.

(30) Foreign Application Priority Data

May 14, 2009 (KR) ........................ 10-2009-0042166

(51) Int. Cl.
*H03L 7/00* (2006.01)

(52) U.S. Cl. ......................... 327/143; 327/142; 327/198

(58) Field of Classification Search .................. 327/142, 327/143, 198
See application file for complete search history.

(56) References Cited

U.S. PATENT DOCUMENTS 4,330,744 A * 5/1982 Embree et al. ................ 323/316
4,970,408 A * 11/1990 Hanke et al. .................. 327/143
5,166,545 A * 11/1992 Harrington .................. 327/143
5,302,861 A * 4/1994 Jelinek .......................... 327/143
5,936,444 A * 8/1999 Pathak et al. ................ 327/143
6,005,423 A * 12/1999 Schultz ......................... 327/143
6,052,006 A * 4/2000 Talaga et al. .................. 327/143
6,104,221 A * 8/2000 Hoon ............................ 327/143
6,239,630 B1 * 5/2001 Bowers et al. ................ 327/143
6,744,291 B2 * 6/2004 Payne et al. .................. 327/143
6,809,565 B2 * 10/2004 Kawakubo .................... 327/143
6,885,605 B2 4/2005 Lee et al.
6,937,074 B2 8/2005 Shin
6,972,602 B2 * 12/2005 Akamatsu et al. ............ 327/143
7,019,417 B2 * 3/2006 Kang ............................ 307/113
7,106,112 B2 * 9/2006 Jang ............................. 327/143
7,123,075 B2 * 10/2006 Iorga ............................ 327/530
7,123,081 B2 * 10/2006 Lyon ............................ 327/543
7,474,130 B1 * 1/2009 Lo et al. ........................ 327/103
7,545,186 B2 * 6/2009 Suzuki et al. ................. 327/143
7,564,278 B2 * 7/2009 Chen ............................ 327/142

(Continued)

FOREIGN PATENT DOCUMENTS

JP 2003-203479 7/2003

(Continued)

*Primary Examiner* — Lincoln Donovan
*Assistant Examiner* — Adam Houston
(74) *Attorney, Agent, or Firm* — Vanable LLP; Jeffri A. Kaminski

(57) ABSTRACT

A power-up signal generating circuit of a semiconductor memory apparatus includes a current source unit configured to supply a current to a first node; a current sink unit configured to be turned on when the level of a divided voltage dividing an external voltage is equal to or higher than a predetermined level to allow the current to flow from a first node to a second node; a control unit configured to control the turn-on timing of the current sink unit by controlling a voltage level of the second node; and a signal generating unit configured to enable a power-up signal depending on a voltage level of the first node.

20 Claims, 5 Drawing Sheets

100
VDD
110
R11
R12
VSS
V_dv
VDD
120
P11
VSS
node A
130
N11
node B
R13
VSS
VDD
N12
VDD
140
150
IV11
pwrup

U.S. PATENT DOCUMENTS 7,786,770 B1 * 8/2010 Liang et al. .................. 327/143
7,969,212 B2 * 6/2011 Rho .............................. 327/143
2005/0135174 A1 6/2005 Lee et al.
2005/0231246 A1 * 10/2005 Kang et al. .................... 327/143
2006/0145739 A1 * 7/2006 Kim .............................. 327/143
2007/0001721 A1 * 1/2007 Chen et al. .................... 327/143
2007/0150770 A1 * 6/2007 Lee ............................... 713/323
2008/0238500 A1 * 10/2008 Jung ............................. 327/143
2009/0160505 A1 * 6/2009 Rho .............................. 327/143
2010/0073042 A1 * 3/2010 Choi ............................. 327/143
2010/0109723 A1 * 5/2010 Shin .............................. 327/143
2010/0289536 A1 * 11/2010 Rho .............................. 327/143
2011/0221484 A1 * 9/2011 Rho .............................. 327/143

FOREIGN PATENT DOCUMENTS

JP 2005-116151 4/2005
KR 102008006037 7/2008

* cited by examiner

CIRCUIT FOR GENERATING POWER-UP SIGNAL OF SEMICONDUCTOR MEMORY APPARATUS

CROSS-REFERENCES TO RELATED PATENT APPLICATION

This application is a divisional of U.S. patent application Ser. No. 12/494,942, filed Jun. 30, 2009, which claims benefit of Korean Patent Application No. 10-2009-0042166, filed on May 14, 2009, in the Korean Intellectual Property Office, the subject matter of which application is incorporated herein by reference in its entirety.

BACKGROUND

1. Technical Field

The embodiment described herein relates to a semiconductor memory apparatus and, more particularly, to a circuit for generating a power-up signal.

2. Related Art

A power-up signal, as a signal for initializing a semiconductor memory apparatus, is enabled when an external voltage is applied to the semiconductor memory apparatus and the level of the external voltage is higher than a predetermined level. At this time, the semiconductor memory apparatus performs an initialization operation during a disable interval of the power-up signal.

As shown in FIG. 1, a conventional circuit for generating a power-up signal can be configured to include first and second resistors R1 and R2, first and second transistors P1 and N1, and an inverter IV1.

The first and second resistors R1 and R2 are connected to each other in series and respectively applied with an external voltage VDD and a ground voltage VSS at terminals thereof. At this time, a divided voltage 'V_dv' is outputted from a node that is connected to the first resistor R1 and the second resistor R2.

The first transistor P1 is applied with the ground voltage VSS at a gate thereof and applied with the external voltage VDD at a source thereof.

The second transistor N1 is applied with the divided voltage 'V_dv' at a gate thereof, connected to a drain of the first transistor P1 at a drain thereof, and applied with the ground voltage VSS at a source thereof.

The inverter IV1 enables a power-up signal 'pwrup' at a high level when a voltage level of a node 'node A' that is connected to the first transistor P1 and the second transistor N2 is lower than a predetermined voltage level.

An operation of the conventional circuit for generating the power-up signal of the semiconductor memory apparatus will be described below.

As the level of the external voltage VDD increases, the level of the divided voltage 'V_dv' also increases.

The voltage level of the node 'node A' also increases through the first transistor P1.

As the voltage level of the node 'node A' increases, the inverter IV1 outputs the power-up signal 'pwrup' disabled at a low level.

As the level of the external voltage VDD increases, the level of the divided voltage 'V_dv' increases to turn on the second transistor N1, such that the second transistor N1 is turned on.

As the second transistor N1 is turned on, the voltage level of the node 'node A' decreases.

When the voltage level of the node 'node A' is equal to or lower than a predetermined voltage level, the inverter IV1 generates the power-up signal 'pwrup' enabled at a high level.

As shown in FIG. 2, the conventional circuit for generating the power-up signal, which operates as above has a disadvantage in that an enable timing of the power-up signal 'pwrup' varies.

More specifically, when a threshold voltage of the first transistor P1 is higher than a threshold voltage designed or a threshold voltage of the second transistor N1 is lower than the threshold voltage designed, the enable timing 'a' of the power-up signal 'pwrup' is earlier than a normal enable timing 'c'.

When the threshold voltage of the first transistor P1 is lower than the threshold voltage designed or the threshold voltage of the second transistor N1 is higher than the threshold voltage designed, the enable timing 'b' of the power-up signal 'pwrup' is later than the normal enable timing 'c'.

That is, the conventional circuit for generating the power-up signal of the general semiconductor memory apparatus has a disadvantage in that the enable timing of the power-up signal varies depending on variation in the process at the time of fabricating the circuit for generating the power-up signal. When the enable timing of the power-up signal is earlier or later than the normal timing, the semiconductor memory apparatus may be mis-operated because an initialization operation of the semiconductor memory apparatus is not normally performed.

SUMMARY

A circuit for generating a power-up signal of a semiconductor memory apparatus capable of enabling the power-up signal at a predetermined timing regardless of variation in the process is disclosed herein.

In an embodiment, a power-up signal generating circuit of a semiconductor memory apparatus comprises: a current source unit configured to supply a current to a first node; a current sink unit configured to be turned on when the level of a divided voltage dividing an external voltage is equal to or higher than a predetermined level to allow the current to flow from a first node to a second node; a control unit configured to control the turn-on timing of the current sink unit by controlling a voltage level of the second node; and a signal generating unit configured to enable a power-up signal depending on a voltage level of the first node.

In another embodiment, a power-up signal generating circuit of a semiconductor memory apparatus comprises: a current source unit configured to supply a current from a first node to a second node; a control unit configured to control a voltage level of the first node so as to maintain an amount of the current that flows from the first node to the second node constantly; a current sink unit configured to allow the current to flow from the second node to a ground terminal when the level of a divided voltage dividing an external voltage is equal to or higher than a predetermined level; and a signal generating unit configured to enable a power-up signal depending on a voltage level of the second node.

In another embodiment, a power-up signal generating circuit of a semiconductor memory apparatus comprises: a current source unit configured to supply a current from a first node to a second node; a first control unit configured to control a voltage level of the first node so as to maintain an amount of the current that flows from the first node to the second node constantly; a current sink unit configured to be turned on when the level of a divided voltage dividing an external voltage is equal to or higher than a predetermined level to allow a current to flow from the second node to a third node; a second control unit configured to control a turn-on timing of the current sink unit by controlling a voltage level of the third node; and a signal generating unit configured to enable a power-up signal depending on a voltage level of the second node.

In another embodiment, a power-up signal generating circuit of a semiconductor memory apparatus comprises: a voltage supply unit configured to apply a voltage to a first node; a voltage dropping unit configured to decrease a voltage level of the first node as the level of a divided voltage dividing an external voltage increases; a control unit configured to control the voltage level of the first node depending on a voltage drop rate of the first node; and a signal generating unit configured to enable a power-up signal depending on the voltage level of the first node.

In another embodiment, a power-up signal generating circuit of a semiconductor memory apparatus comprises: a voltage supply unit configured to increase a voltage level of a first node; a control unit configured to control the voltage level of the first node depending on a voltage increasing rate of the first node; a voltage dropping unit configured to decrease the voltage level of the first node as the level of a divided voltage dividing an external voltage increases; and a signal generating unit configured to enable a power-up signal depending on the voltage level of the first node.

In another embodiment, a power-up signal generating circuit of a semiconductor memory apparatus comprises: a voltage supply unit configured to increase a voltage level of a first node; a first control unit configured to control the voltage level of the first node depending on a voltage increasing rate of the first node; a voltage dropping unit configured to decrease the voltage level of the first node as the level of a divided voltage dividing an external voltage increases; a second control unit configured to control the voltage level of the first node depending on a voltage drop rate of the first node; and a signal generating unit configured to enable a power-up signal depending on the voltage level of the first node.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
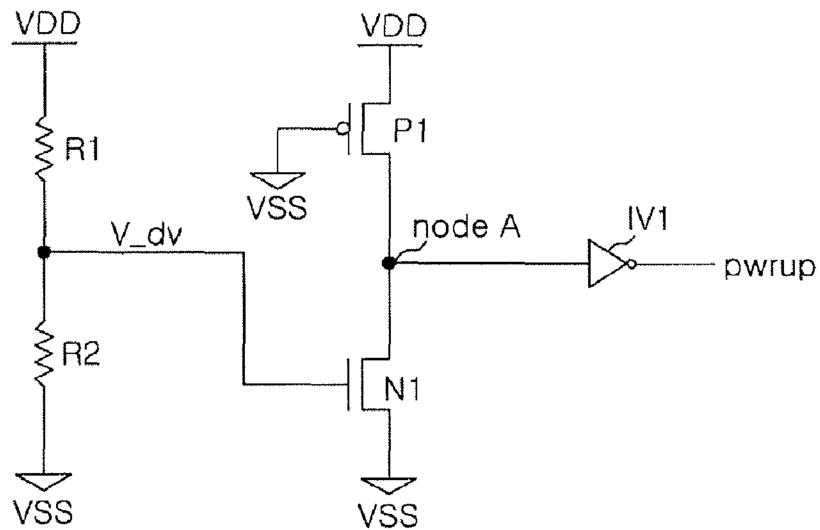
FIG. 1 is a configuration diagram of a conventional circuit for generating a power-up signal of a semiconductor memory apparatus.
Figure 2:
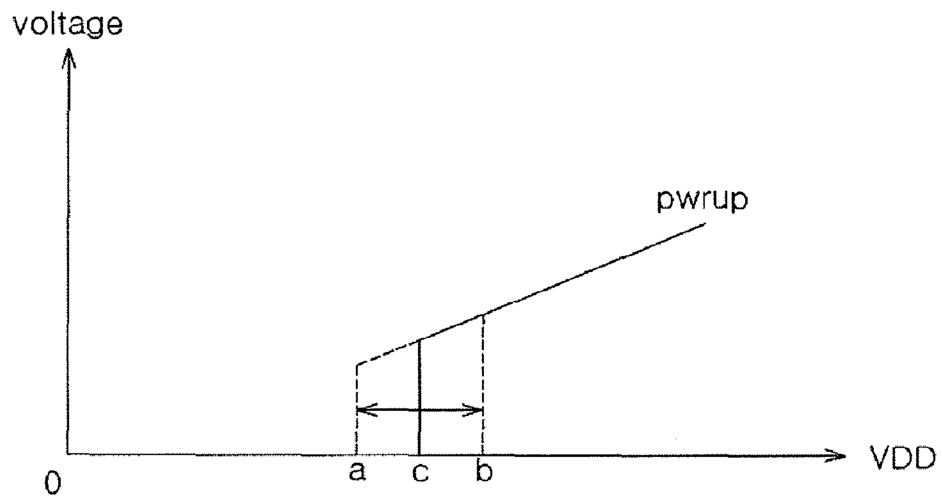
FIG. 2 is an operation timing diagram that can be included with the circuit of FIG. 1.
Figure 3:
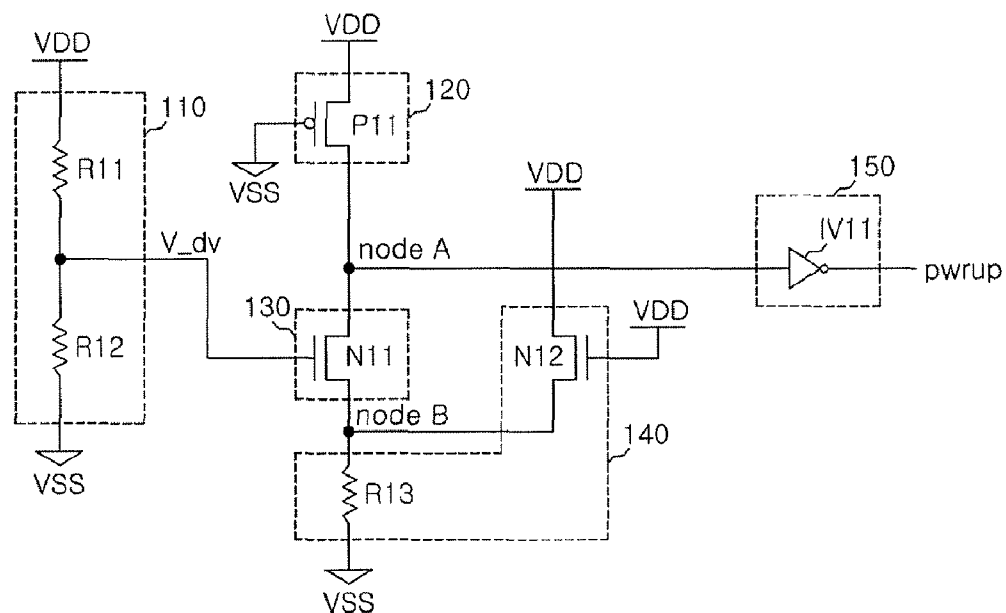
FIG. 3 is a configuration diagram of a circuit for generating a power-up signal of a semiconductor memory apparatus according to an embodiment.

A power-up signal generating circuit 100 of a semiconductor memory apparatus according to an embodiment can be configured to include a voltage dividing unit 110, a current source unit 120, a current sink unit 130, a control unit 140, and a signal generating unit 150 as shown in FIG. 3.

The voltage dividing unit 110 can divide and output an external voltage VDD as a divided voltage 'V_dv'.

The voltage dividing unit 110 can be configured to include first and second resistors R11 and R12. The first resistor R11 is applied with the external voltage VDD at one terminal thereof. The other terminal of the first resistor R11 is connected to one terminal of the second resistor R12 and a ground terminal VSS is connected to the other terminal of the second resistor R12. At this time, the divided voltage 'V_dv' is outputted from a node that is connected to the first resistor R11 and the second resistor R12.

The current source unit 120 can supply a current to a first node 'node A' that is connected to the current sink unit 130.

The current source unit 120 can be configured to include a first transistor P11. The first transistor P11 is connected to the ground terminal VSS at a gate thereof, applied with the external voltage VDD at a source thereof, and connected to the first node 'node A' at a drain thereof to supply the external voltage to the first node 'node A'.

When the level of the divided voltage 'V_dv' is equal to or higher than a predetermined voltage level, the current sink unit 130 is turned on to supply a current from the first node 'node A' to a second node 'node B' that is a connection node for connecting the current sink unit 130 and the control unit 140 to each other.

The current sink unit 130 can be configured to include a second transistor N11. The second transistor N11 is applied with the divided voltage 'V_dv' at a gate thereof, and connected to the first node 'node A' and the second node 'node B' at a drain and a source thereof, respectively.

The control unit 140 can control a voltage level of the second node 'node B' in order to control a turn-on timing of the current sink unit 130.

The control unit 140 can be configured to include a third resistor R13 and a third transistor N12. The second node 'node B' is connected to one terminal of the third resistor R13 and the ground terminal VSS is connected to the other terminal of the third resistor R13. The third transistor N12 is applied with the external voltage VDD at a gate and a drain thereof and connected to the second node 'node B' at a source thereof. At this time, the third transistor N12, as an NMOS transistor designed to have the same threshold voltage as the second transistor N11, can be formed in the same size and the same fabrication scheme.

When the voltage level of the first node 'node A' is lower than the predetermined voltage level, the signal generating unit 150 can enable a power-up signal 'pwrup' at a high level.

The signal generating unit 150 can be configured to include an inverter IV11. The inverter IV11 is connected to the first node 'node A' at an input terminal thereof and outputs the power-up signal 'pwrup' at an output terminal thereof.

An operation of the power-up signal generating circuit 100 of the semiconductor memory apparatus will be described below.

As the level of the external voltage VDD increases, the level of the divided voltage 'V_dv' also increases.

The current source unit 120 can supply a current to the first node 'node A'. Therefore, the voltage level of the first node 'node A' starts to increase.

When the level of the divided voltage 'V_dv' is equal to or higher than a predetermined voltage level, the current sink unit 130 is turned on to discharge the current from the first node 'node A' to the second node 'node B'.

As shown in FIG. 3, since the current sink unit 130 is constituted by the second transistor N11, the second transistor N11 may be turned on even in a case when the level of the divided voltage 'V_dv' does not reach the predetermined voltage level when a threshold voltage of the second transistor N11 is lower than a predetermined threshold voltage level due to variation in the process at the time of fabricating the second transistor N11. Further, due to the reason, when the threshold voltage of the second transistor N11 is higher than a predetermined voltage level designed, the level of the divided voltage 'V_dv' needs to be higher than the predetermined voltage level to turn on the second transistor N11.

As described above, since the control unit 140 is constituted by a transistor having the same threshold voltage as the second transistor N11 constituting the current sink unit 130, a threshold voltage of the third transistor N12 constituting the control unit 140 also varies when the threshold voltage of the second transistor N11 varies. Therefore, when the threshold voltages of the second and third transistors N11 and N12 decrease to the predetermined voltage level or less, the third transistor N12 supplies a current of an amount larger than that designed to the second node 'node B'. As a result, since the third resistor R13 is supplied with the current of the amount larger than that designed, a voltage level of the second node 'node B' is higher than that designed.

Accordingly, even though the threshold voltage of the second transistor N11 is lower than that designed, a voltage level of the source of the second transistor N11, that is, the voltage level of the second node 'node B' increases. Therefore, the level of the divided voltage 'V_dv' applied to a gate of the second transistor N11 needs to be higher than a predetermined voltage level designed to turn on the second transistor N11. Accordingly, it is possible to compensate the threshold voltage of the second transistor N11 lower than the predetermined voltage level designed.

Further, when the threshold voltages of the second transistor N11 and the third transistor N12 are higher than the predetermined voltage level designed, the third transistor N12 allows a current of an amount smaller than that designed to flow to the second node 'node B'. Therefore, the third resistor R13 is supplied with the current of the amount smaller than that designed, the voltage level of the second node 'node B' is lower than that designed.

Even though the threshold voltage of the second transistor N11 is higher than that designed, the voltage level of the source of the second transistor N11 is lower than that designed by the control unit 140. Therefore, even though the divided voltage 'V_dv' applied to the gate of the second transistor N11 is lower than the predetermined voltage level designed, the second transistor N11 can be turned on.

When the voltage level of the first node 'node A' is lower than the predetermined voltage level by turning on the second transistor N11, the signal generating unit 150 enables the power-up signal 'pwrup' at a high level.

The power-up signal generating circuit 100 of the semiconductor memory apparatus is configured to enable a power-up signal at an external voltage level designed regardless of variation in the process of an NMOS transistor constituting the power-up signal generating circuit 100. The power-up signal generating circuit 100 of the semiconductor memory apparatus increases a voltage level of a source of an NMOS transistor N11 when a threshold voltage of the NMOS transistor N11 constituting the power-up signal generating circuit is lower than that designed and decreases the voltage level of the source of the NMOS transistor N11 when the threshold voltage of the NMOS transistor N11 is higher than that designed to enable the power-up signal by turning on the NMOS transistor N11 at an external voltage level designed.

Consequently, since the power-up signal generating circuit 100 of the semiconductor memory apparatus can constantly maintain an enable timing of the power-up signal regardless of variation in the process, the power-up signal generating circuit 100 can ensure a normal initialization operation of the semiconductor memory apparatus and minimize an initialization operation time.

Figure 4:
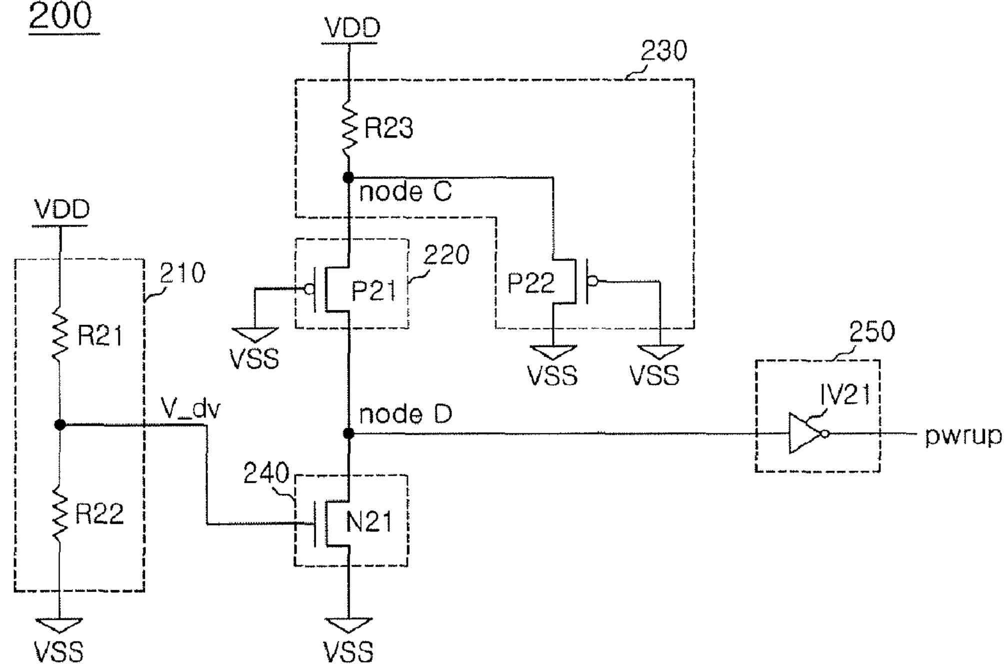
FIG. 4 is a configuration diagram of a circuit for generating a power-up signal of a semiconductor memory apparatus according to another embodiment.

A power-up signal generating circuit 200 of a semiconductor memory apparatus according to another embodiment can be configured to include a voltage dividing unit 210, a current source unit 220, a control unit 230, a current sink unit 240, and a signal generating unit 250 as shown in FIG. 4.

The voltage dividing unit 210 can divide and output an external voltage VDD as a divided voltage 'V_dv'.

The voltage dividing unit 210 can be configured to include first and second resistors R21 and R22. The first resistor R21 is applied with the external voltage VDD at one terminal thereof. The other terminal of the first resistor R21 is connected to one terminal of the second resistor R22 and a ground terminal VSS is connected to the other terminal of the second resistor R22. At this time, the divided voltage 'V_dv' is outputted from a node that is connected to the first resistor R21 and the second resistor R22.

The current source unit 220 can supply a current from the first node 'node C' to a second node 'node D'.

The current source unit 220 can be configured to include a first transistor P21. The ground terminal VSS is connected to a gate of the first transistor P21 and the first node 'node C' and the second node 'node D' are connected respectively to a source and a drain of the first transistor P21.

The control unit 230 can control a voltage level of the first node 'node C' so as to maintain an amount of a current that flows from the first node 'node C' to the second node 'node D' constantly.

The control unit 230 can be configured to include a third resistor R23 and a second transistor P22. The third resistor R23 is applied with the external voltage VDD at one terminal thereof. The ground terminal VSS is connected to a gate of the second transistor P22, the first node 'node C' is connected to a source of the second transistor P22, and the ground terminal VSS is connected to a drain of the second transistor P22. At this time, the first transistor P21 and the second transistor P22 are transistors of the same type as a PMOS transistor.

The current sink unit 240 allows the current to flow from the second 'node D' to the ground terminal VSS when the divided voltage 'V_dv' is equal to or higher than a predetermined level.

The current sink unit 240 can be configured to include a third transistor N21. The third transistor N21 is applied with the divided voltage 'V_dv' at a gate thereof, connected to the second node 'node D' at a drain thereof, and connected to the ground terminal VSS at a source thereof.

When a voltage level of the second node 'node D' is lower than a predetermined voltage level, the signal generating unit 250 can enable a power-up signal 'pwrup'.

The signal generating unit 250 can be configured to include an inverter IV21. The inverter IV21 is connected to the second node 'node D' at an input terminal thereof and outputs the power-up signal 'pwrup' at an output terminal thereof.

An operation of the power-up signal generating circuit 200 of the semiconductor memory apparatus will be described below.

As the level of the external voltage VDD increases, the level of the divided voltage 'V_dv' also increases.

The first transistor P21 allows the current to flow from the first node 'node C' to the second node 'node D'.

If a threshold voltage of the first transistor P21 is higher than that designed, a current of an amount smaller than that designed flows from the first node 'node C' to the second node 'node D'. If the threshold voltage of the first transistor P21 is lower than that designed, a current of an amount larger than that designed flows from the first node 'node C' to the second node 'node D'. Therefore, when the threshold voltage of the first transistor P21 is higher or lower than that designed, the voltage level of the second node 'node D' is different from that designed, such that a time taken for the voltage level of the second node 'node D' to be lower than a predetermined voltage level varies. As a result, an enable timing of the power-up signal 'pwrup' varies.

The second transistor P22 of the control unit 230, as a transistor of the same type as the first transistor P21, is implemented through the same process. Therefore, the threshold voltages of the first transistor P21 and the second transistor P22 are implemented by the same voltage level.

If the levels of the threshold voltages of the first and second transistors P21 and P22 are higher than those designed, an amount of a current that flows from the first node 'node C' to the ground voltage VSS through the second transistor P22 is smaller than that designed, such that a voltage level of the first node 'node C' is higher than that designed.

The voltage level of the first node 'node C' is higher than that designed and a gate-source voltage level of the first transistor P21 is higher than that designed. Therefore, even though the threshold voltage level of the first transistor P21 is higher than that designed, an amount of a current that flows from the first node 'node C' to the second node 'node D' through the first transistor P21 may be equal to that designed.

Since the second node 'node D' is supplied with the current of the amount equal to that designed, the voltage level of the second node 'node D' is equal to that designed.

When the level of the divided voltage 'D_dv' is equal to or higher than a predetermined level, the third transistor N21 of the current sink unit 240 is turned on to decrease the voltage level of the second node 'node D'.

When the voltage level of the second node 'node D' is equal to or lower than a predetermined voltage level, the signal generating unit 250 can enable the power-up signal 'pwrup'.

Further, when the threshold voltages of the first and second transistors P21 and P22 are lower than those designed, the amount of the current that flows from the first node 'node C' to the ground voltage VSS through the second transistor P22 is larger than that designed. Therefore, the voltage level of the first node 'node C' is lower than that designed.

Even though the threshold voltage level of the first transistor P21 is lower than that designed, the gate-source voltage of the first transistor P21 is lower than that designed, such that the first transistor P21 allows a current of an amount equal to that designed to flow from the first node 'node C' to the second node 'node D'.

Accordingly, the power-up signal 'pwrup' can be enabled at a predetermined timing.

Since the power-up signal generating circuit 200 of the semiconductor memory apparatus can provide an amount of a current supplied to the input terminal of the signal generating unit 250, which is equal to that designed regardless of variation in the process, the power-up signal generating circuit 200 can enable the power-up signal at a predetermined timing.

Consequently, since the power-up signal generating circuit 200 of the semiconductor memory apparatus can constantly maintain the enable timing of the power-up signal regardless of the variation in the process, the power-up signal generating circuit 200 can ensure a normal initialization operation of the semiconductor memory apparatus and minimize an initialization operation time.

Figure 5:
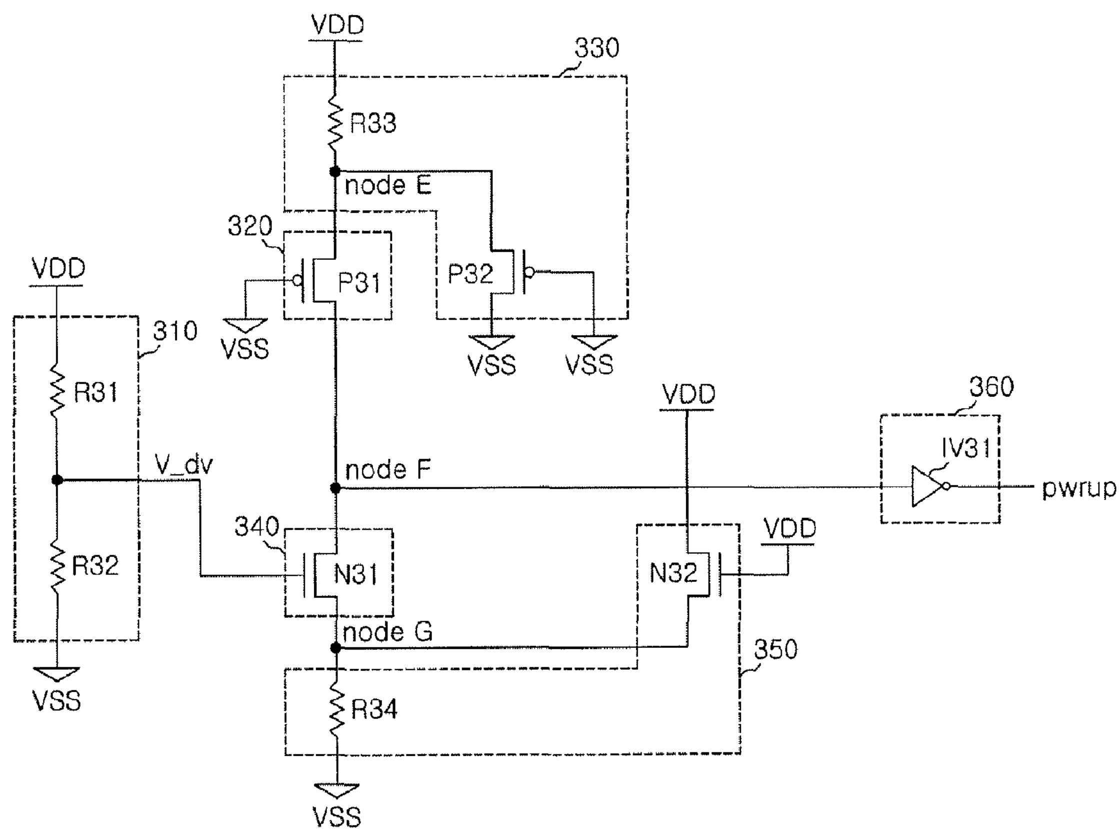
FIG. 5 is a configuration diagram of a circuit for generating a power-up signal of a semiconductor memory apparatus according to another embodiment.

A power-up signal generating circuit 300 of a semiconductor memory apparatus according to another embodiment can be configured to include a voltage dividing unit 310, a current source unit 320, a first control unit 330, a current sink unit 340, a second control unit 350, and a signal generating unit 360 as shown in FIG. 5.

The voltage dividing unit 310 can output a divided voltage 'V_dv' by dividing an external voltage VDD.

The voltage dividing unit 310 can be configured to include first and second resistors R31 and R32. The first resistor R31 is applied with the external voltage VDD at one terminal thereof. The other terminal of the first resistor R31 is connected to one terminal of the second resistor R32 and a ground terminal VSS is connected to the other terminal of the second resistor R22.

The current source unit 320 can supply a current from a first node 'node E' to a second node 'node F'.

The current source unit 320 can be configured to include a first transistor P31. The ground terminal VSS is connected to a gate of the first transistor P31 and the first node 'node E' and the second node 'node F' are connected respectively to a source and a drain of the first transistor P31.

The first control unit 330 can control a voltage level of the first node 'node E' so as to maintain an amount of a current that flows from the first node 'node E' to the second node 'node F' constantly.

The first control unit 330 can be configured to include a third resistor R33 and a second transistor P32. The third resistor R33 is applied with the external voltage VDD at one terminal thereof and connected to the first node 'node E' at the other terminal thereof. The ground terminal VSS is connected to a gate of the second transistor P32, the first node 'node E' is connected to a source of the second transistor P32, and the ground terminal VSS is connected to a drain of the second transistor P32. At this time, the first transistor P31 and the second transistor P32 are transistors of the same type as a PMOS transistor.

When the level of the divided voltage 'V_dv' is equal to or higher than a predetermined voltage level, the current sink unit 340 is turned on to allow a current to flow from the second node 'node F' to a third node 'node G'.

The current sink unit 340 can be configured to include a third transistor N31. The third transistor N31 is applied with the divided voltage 'V_dv' at a gate thereof, and connected to the second node 'node F' and the third node 'node G' at a drain and a source thereof, respectively.

The second control unit 350 can control a voltage level of the third node 'node G' in order to control a turn-on timing of the current sink unit 340.

The second control unit 350 can be configured to include a third resistor R34 and a fourth transistor N32. The third node 'node G' is connected to one terminal of the third resistor R34 and the ground terminal VSS is connected to the other terminal of the third resistor R34. The fourth transistor N32 is applied with the external voltage VDD at a gate and a drain thereof and connected to the third node 'node G' at a source thereof. At this time, the third transistor N31 and the fourth transistor N32 are transistors of the same type as an NMOS transistor.

The signal generating unit 360 can be configured to include an inverter IV31. When a voltage level of the second node 'node F' is lower than a predetermined voltage level, the signal generating unit 360 can enable a power-up signal 'pwrup'.

An operation of the power-up signal generating circuit 300 of the semiconductor memory apparatus will be described below.

The first transistor P31 of the current source unit 320 and the second transistor P32 of the first control unit 330, as transistors of the same type, are implemented through the same process.

If threshold voltages of the first and second transistors P31 and P32 are higher than those designed, the second transistor P32 makes a voltage level of the first node 'node E' be higher than that designed and a gate-source voltage of the first transistor P31 is higher than that designed. Therefore, even though the threshold voltage of the first transistor P32 is higher than that designed, the level of the gate-source voltage of the first transistor P32 is higher than that designed, such that the first transistor P32 can supply a current of an amount equal to that designed to the second node 'node F'.

If the threshold voltages of the first and second transistors P31 and P32 are lower than those designed, the second transistor P32 makes the voltage level of the first node 'node E' be lower than that designed and the gate-source voltage of the first transistor P31 is lower than that designed. Therefore, even though the threshold voltage of the first transistor P31 is lower than that designed, the level of the gate-source voltage of the first transistor P31 is lower than that designed, such that the first transistor P31 can supply the current of the amount equal to that designed.

The third transistor N31 of the current sink unit 340 and the fourth transistor N32 of the second control unit 350, as transistors of the same type, are implemented through the same process.

If threshold voltages of the third and fourth transistors N31 and N32 are higher than those designed, the fourth transistor N32 makes a voltage level of the third node 'node G' be lower than that designed. Therefore, the third transistor N31 can be turned on when the divided voltage 'V_dv' applied to the gate of the third transistor N31 has the same level as that designed.

Further, if the threshold voltages of the third and fourth transistors N31 and N32 are lower than those designed, the fourth transistor N32 makes the voltage level of the third node 'node G' be higher than that designed. Therefore, the third transistor N31 can be turned on when the divided voltage 'V_dv' applied to the gate of the third transistor N31 has the same level as that designed.

The current of the amount equal to that designed is supplied to the second node 'node F' regardless of variation in the process and the voltage level of the second node 'node F' decreases at the level of the divided voltage 'V_dv' equal to that designed.

When the voltage level of the second node 'node F' is lower than a predetermined voltage level, the signal generating unit 360 can enable the power-up signal 'pwrup'.

The power-up signal generating circuit 300 of the semiconductor memory apparatus supplies the current of the amount equal to that designed to the second node 'node F' regardless of the variation in the process and decreases the voltage level of the second node 'node F' at the level of the divided voltage 'V_dv' equal to that designed to thereby maintain an enable timing of the power-up signal 'pwrup' constantly.

Consequently, since the power-up signal generating circuit 300 of the semiconductor memory apparatus can constantly maintain the enable timing of the power-up signal regardless of the variation in the process, the power-up signal generating circuit 300 can ensure a normal initialization operation of the semiconductor memory apparatus and minimize an initialization operation time.

Figure 6:
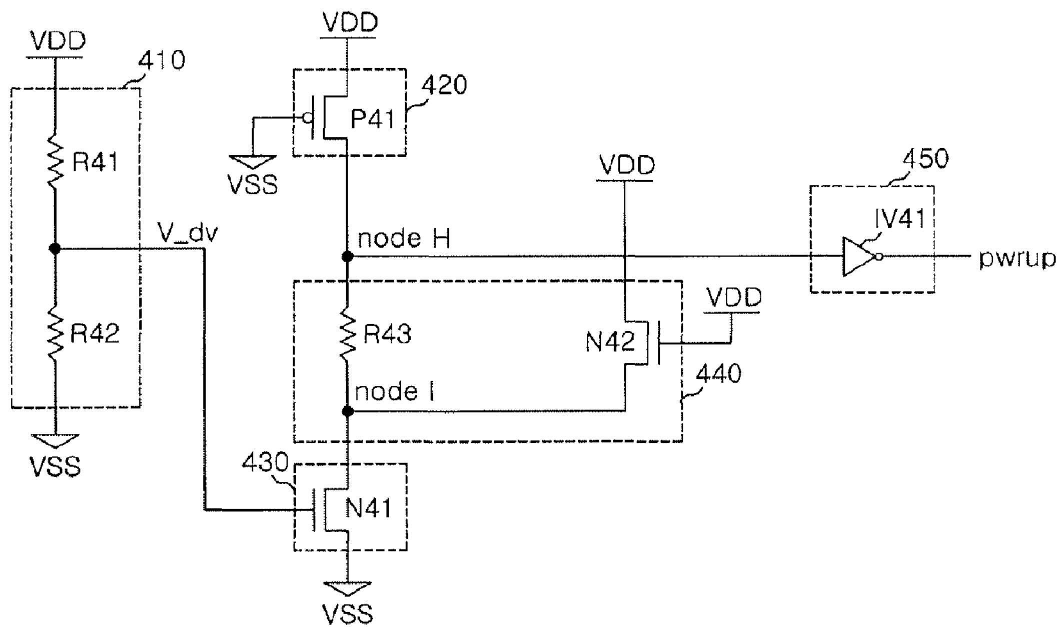
FIG. 6 is a configuration diagram of a circuit for generating a power-up signal of a semiconductor memory apparatus according to another embodiment.

A power-up signal generating circuit 400 of a semiconductor memory apparatus according to another embodiment can be configured to include a voltage dividing unit 410, a voltage supply unit 420, a voltage dropping unit 430, a control unit 440, and a signal generating unit 450 as shown in FIG. 6.

The voltage dividing unit 410 can be configured to include first and second resistors R41 and R42. The voltage dividing unit 410 can divide an external voltage VDD depending on resistance levels of the first and second resistors R41 and R42 and output the divided external voltage VDD as a divided voltage 'V_dv'.

The voltage supply unit 420 can apply a voltage to a first node 'node H'.

The voltage supply unit 420 can be configured to include a first transistor P41 that is connected to a ground terminal VSS at a gate thereof, applied with the external voltage VDD at a source thereof, and connected to the first node 'node H' at a drain thereof.

As the level of the divided voltage 'V_dv' increases, the voltage dropping unit 430 decreases a voltage level of the first node 'node H'.

The voltage dropping unit 430 can be configured to include a second transistor N41. The second transistor N41 is applied with the divided voltage 'V_dv' at a gate thereof, connected to a second node 'node I' at a drain thereof, and connected to the ground terminal VSS at a source thereof.

The control unit 440 can control the voltage level of the first node 'node H' depending on a voltage drop rate of the first node 'node H'. For example, the control unit 440 increases the voltage level of the first node 'node H' when the voltage drop rate of the first node 'node H' is higher than a predetermined voltage drop rate and decreases the voltage level of the first node 'node H' when the voltage drop rate of the first node 'node H' is lower than the predetermined voltage drop rate.

The control unit 440 can be configured to include a third resistor R43 and a third transistor N42. The third resistor R43 is connected between the first node 'node H' and the second node 'node I'. The third transistor N42 is applied with the external voltage VDD at a gate and a drain thereof and connected to the second node 'node I' at a source thereof. At this time, the second transistor N41 and the third transistor N42 are transistors of the same type as an NMOS transistor.

The signal generating unit 450 can be configured to include an inverter IV41. When the voltage level of the first node 'node H' is lower than the predetermined voltage level, the signal generating unit 450 can enable a power-up signal 'pwrup'.

An operation of the power-up signal generating circuit 400 of the semiconductor memory apparatus will be described below.

As the level of the external voltage VDD increases, the level of the divided voltage 'V_dv' also increases.

The voltage supply unit 420 increases the voltage level of the first node 'node H'.

If threshold voltages of the second transistor N41 of the voltage dropping unit 430 and the third transistor N42 of the control unit 440 are higher than those designed, the third transistor N42 increases a voltage level of the second node 'node I' at a voltage increasing rate lower than a predetermined voltage increasing rate. However, the second transistor N41 decreases the voltage level of the second node 'node I' at a voltage dropping rate lower than a predetermined voltage dropping rate as the divided voltage 'V_dv' increases.

Therefore, since a voltage dropping rate of the second node 'node I' is maintained to be same as that designed, the voltage drop rate of the first node 'node H' is also maintained to be the same as that designed.

Consequently, when the threshold voltages of the second and third transistors N41 and N42 are higher than those designed, the voltage level of the first node 'node H' is lower than the predetermined voltage level at the level of the external voltage VDD equal to that designed. The signal generating unit 450 can enable the power-up signal 'pwrup' when the voltage level of the first node 'node H' is lower than the predetermined voltage level.

Further, when the threshold voltages of the second transistor N41 and the third transistor N42 are lower than those designed, the third transistor N42 makes the voltage level of the second node 'node I' be higher than that designed and as the level of the divided voltage 'V_dv' increases, the second transistor N41 drops the voltage level of the second node 'node I' at a voltage drop rate higher than a predetermined voltage drop rate.

As a result, when the threshold voltages of the second and third transistors N41 and N42 are lower than those designed, the voltage level of the first node 'node H' is lower than the predetermined voltage level at the level of the external voltage VDD designed. When the voltage level of the first node 'node H' is lower than the predetermined voltage level, the power-up signal 'pwrup' is enabled.

Consequently, since the power-up signal generating circuit 400 of the semiconductor memory apparatus can constantly maintain an enable timing of the power-up signal regardless of variation in the process, the power-up signal generating circuit 400 can ensure a normal initialization operation of the semiconductor memory apparatus and minimize an initialization operation time.

Figure 7:
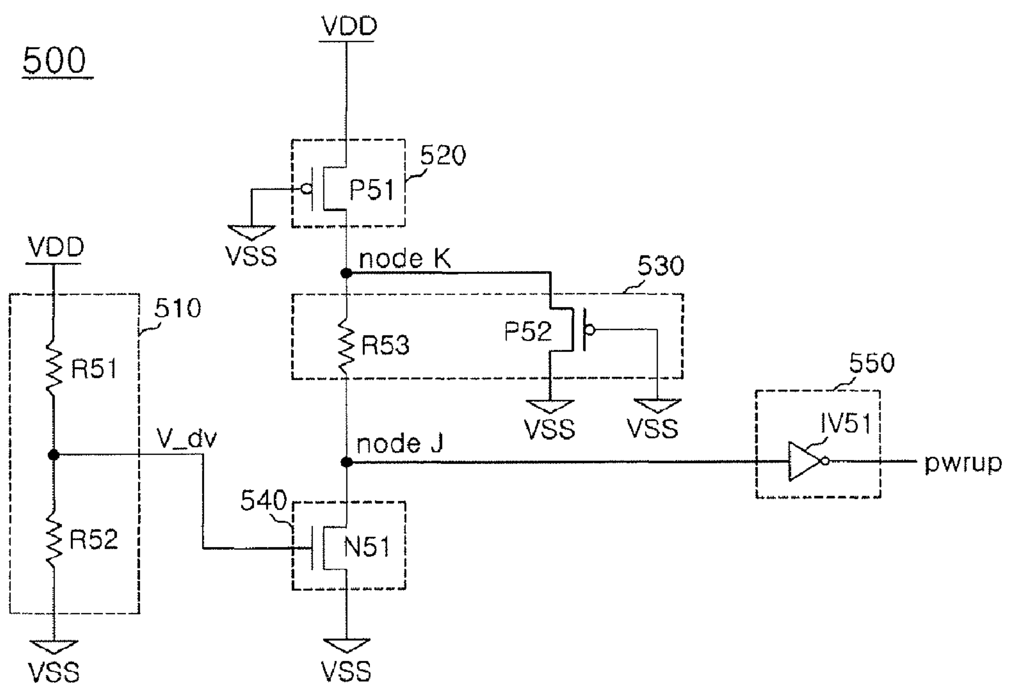
FIG. 7 is a configuration diagram of a circuit for generating a power-up signal of a semiconductor memory apparatus according to another embodiment.

A power-up signal generating circuit 500 of a semiconductor memory apparatus according to another embodiment can be configured to include a voltage dividing unit 510, a voltage supply unit 520, a control unit 530, a voltage dropping unit 540, and a signal generating unit 550 as shown in FIG. 7.

The voltage dividing unit 510 can be configured to include first and second resistors R51 and R52. The voltage dividing unit 510 can divide an external voltage VDD and generate a divided voltage 'V_dv'.

The voltage supply unit 520 increases a voltage level of the first node 'node J'. The voltage supply unit 520 can increase the voltage level of the first node 'node J' by applying a voltage to a second node 'node K'.

The voltage supply unit 520 can be configured to include a first transistor P51. The first transistor P51 is connected to a ground terminal VSS at a gate thereof, applied with the external voltage VDD at a source thereof, and connected to the second node 'node K' at a drain thereof. At this time, the voltage levels of the first node 'node J' and the second node 'node K' increase or decrease at the same time by the same voltage difference.

The control unit 530 can control the voltage level of the first node 'node J' depending on a voltage increasing rate of the first node 'node J'. For example, the control unit 530 decreases the voltage level of the first node 'node J' when the voltage increasing rate of the first node 'node J' is higher than a predetermined voltage increasing rate and increases the voltage level of the first node 'node J' when the voltage increasing rate of the first node 'node J' is lower than the predetermined voltage increasing rate.

The control unit 530 can be configured to include a third resistor R53 and a second transistor P52. The third resistor R53 is connected between the first node 'node J' and the second node 'node K'. The ground terminal VSS is connected to a gate of the second transistor P52, the second node 'node K' is connected to a source of the second transistor P52, and the ground terminal VSS is connected to a drain of the second transistor P52. At this time, the first transistor P51 and the second transistor P52 are transistors of the same type as a PMOS transistor.

As the level of the divided voltage 'V_dv' increases, the voltage dropping unit 540 decreases the voltage level of the first node 'node J'.

The voltage dropping unit 540 can be configured to include a third transistor N51. The third transistor N51 is applied with the divided voltage 'V_dv' at a gate thereof, connected to the first node 'node J' at a drain thereof, and connected to the ground terminal VSS at a source thereof.

The signal generating unit 550 can be configured to include an inverter IV51. When the voltage level of the first node 'node J' is lower than a predetermined voltage level, the signal generating unit 550 can enable a power-up signal 'pwrup'.

An operation of the power-up signal generating circuit 500 of the semiconductor memory apparatus will be described below.

As the level of the external voltage VDD increases, the level of the divided voltage 'V_dv' also increases.

The voltage supply unit 520 increases the voltage level of the second node 'node K'. As the voltage level of the second node 'node K' increases, the voltage level of the first node 'node J' also increases.

If levels of threshold voltages of the first transistor P51 of the voltage supply unit 520 and the second transistor P52 of the control unit 530 are higher than those designed, the voltage level of the second node 'node K' is higher than that designed by the second transistor P52. However, a voltage increasing rate of the second node 'node K' is lower than that designed by the first transistor P51. As a result, the second node 'node K' can maintain a voltage level designed.

Since the first node 'node J' and the second node 'node K' maintain the same voltage difference, the first node 'node J' also maintains the voltage level designed when the second node 'node K' maintains the voltage level designed.

As the level of the divided voltage 'V_dv' increases, the voltage dropping unit 540 drops the voltage level of the first node 'node J'.

The signal generating unit 550 can enable the power-up signal 'pwrup' when the voltage level of the first node 'node J' is lower than the predetermined voltage level.

Further, when the threshold voltages of the first transistor P51 and the second transistor P52 are lower than those designed, the second transistor P52 drops the voltage level of the second node 'node K' at a voltage drop rate higher than a predetermined voltage drop rate even though the voltage level of the second node 'node K' is higher than the predetermined voltage level by the first transistor P51. Accordingly, the second node 'node K' maintains a voltage level designed and the first node 'node J' can also maintain a voltage level designed.

The first node 'node J' can maintain the voltage level designed in spite of variation in the process of the transistor.

Therefore, the voltage dropping unit 540 can decrease the voltage level of the first node 'node J' to the predetermined voltage level or less at the divided voltage 'V_dv' of a predetermined voltage level, that is, the level of the external voltage VDD. That is, the power-up signal 'pwrup' is enabled.

Consequently, since the power-up signal generating circuit 500 of the semiconductor memory apparatus can constantly maintain an enable timing of the power-up signal regardless of variation in the process, the power-up signal generating circuit 500 can ensure a normal initialization operation of the semiconductor memory apparatus and minimize an initialization operation time.

Figure 8:
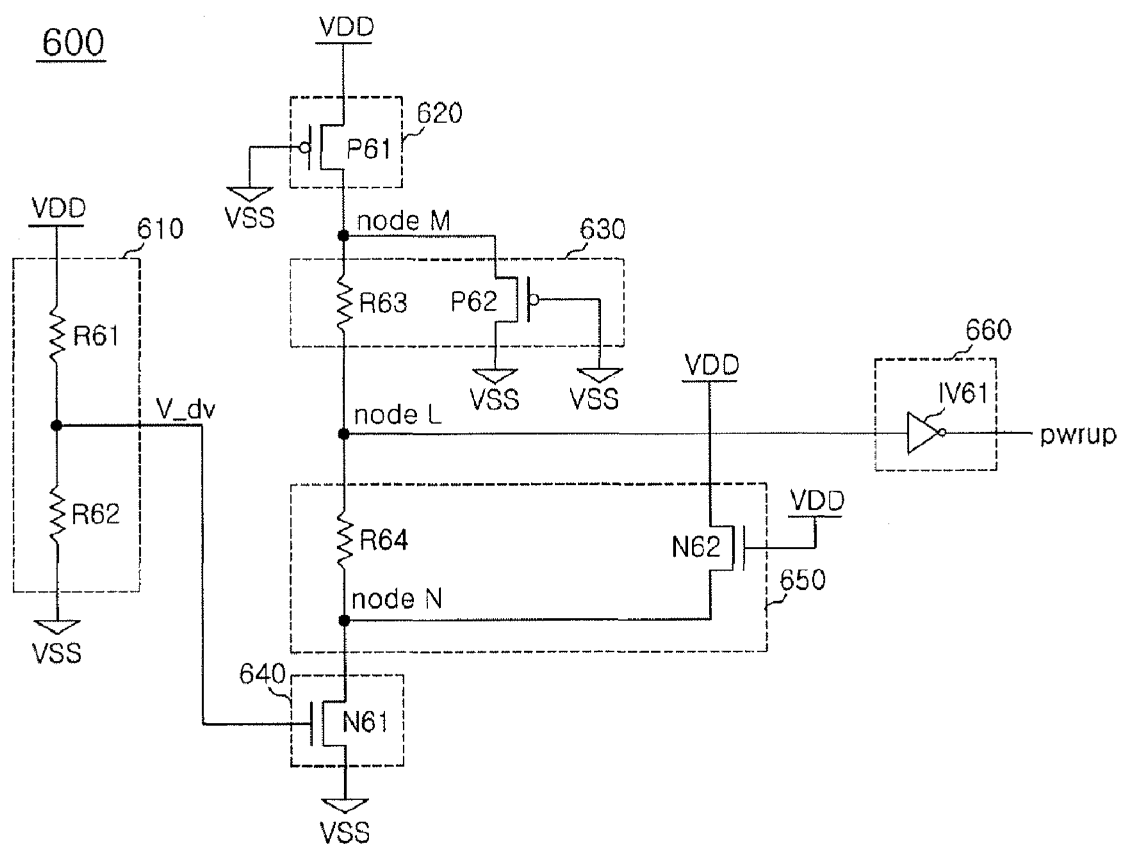
FIG. 8 is a configuration diagram of a circuit for generating a power-up signal of a semiconductor memory apparatus according to another embodiment.

A power-up signal generating circuit 600 of a semiconductor memory apparatus according to another embodiment can be configured to include a voltage dividing unit 610, a voltage supply unit 620, a first control unit 630, a voltage dropping unit 640, a second control unit 650, and a signal generating unit 660 as shown in FIG. 8.

The voltage dividing unit 610 can be configured to include first and second resistors R61 and R62. The voltage dividing unit 610 can divide an external voltage VDD and generate a divided voltage 'V_dv'.

The voltage supply unit 620 increases a voltage level of the first node 'node L'. The voltage supply unit 620 increases the voltage level of the first node 'node L' by increasing a voltage level of a second node 'node M'. At this time, the voltage levels of the first node 'node L' and the second node 'node M' is similar in variance.

The voltage supply unit 620 can be configured to include a first transistor P61. The first transistor P61 is connected to a ground terminal VSS at a gate thereof, applied with the external voltage VDD at a source thereof, and connected to the second node 'node M' at a drain thereof.

The first control unit 630 can control the voltage level of the first node 'node L' depending on a voltage increasing rate of the first node 'node L'. Since the voltage levels of the first node 'node L' and the second node 'node M' is similar in variance, the first control unit 630 can control the voltage level of the first node 'node L' by controlling the voltage level of the second node 'node M' depending on a voltage increasing rate of the second node 'node M'. The first control unit 630 decreases the voltage level of the first node 'node L' when the voltage increasing rate of the first node 'node L' is higher than a predetermined voltage increasing rate and increases the voltage level of the first node 'node L' when the voltage increasing rate of the first node 'node L' is lower than the predetermined voltage increasing rate.

The first control unit 630 can be configured to include a third resistor R63 and a second transistor P62. The third resistor R63 is connected between the first node 'node L' and the second node 'node M'. The ground terminal VSS is connected to a gate and a drain of the second transistor P62, and connected to the second node 'node M' at source of the second transistor P62.

As the level of the divided voltage 'V_dv' increases, the voltage dropping unit 640 decreases the voltage level of the first node 'node L'. The voltage dropping unit 640 decreases the voltage level of the first node 'node L' by decreasing a voltage level of a third node 'node N'. At this time, the voltage levels of the first node 'node L' and the third node 'node N' vary similarly.

The voltage dropping unit 640 can be configured to include a third transistor N61. The third transistor N61 is applied with the divided voltage 'V_dv' at a gate thereof, connected to the third node 'node N' at a drain thereof, and connected to the ground terminal VSS at a source thereof.

The second control unit 650 can control the voltage level of the first node 'node L' depending on a voltage drop rate of the first node 'node L'. Since the voltage levels of the first node 'node L' and the third node 'node N' is similar in variance, the second control unit 650 can control the voltage level of the first node 'node L' by controlling the voltage level of the third node 'node N' depending on a voltage drop rate of the third node 'node N'. The second control unit 650 increases the voltage level of the first node 'node L' when the voltage drop rate of the first node 'node L' is higher than a predetermined voltage drop rate and decreases the voltage level of the first node 'node L' when the voltage drop rate of the first node 'node L' is lower than the predetermined voltage drop rate.

The second control unit 650 can be configured to include a fourth resistor R64 and a fourth transistor N62. The fourth resistor R64 is connected between the first node 'node L' and the third node 'node N'. The fourth transistor N62 is applied with the external voltage VDD at a gate and a drain thereof and connected to the third node 'node N' at a source thereof.

The signal generating unit 660 can be configured to include an inverter IV61. When the voltage level of the first node 'node L' is lower than the predetermined voltage level, the signal generating unit 660 can enable a power-up signal 'pwrup'.

An operation of the power-up signal generating circuit 600 of the semiconductor memory apparatus will be described below.

As the level of the external voltage VDD increases, the level of the divided voltage 'V_dv' also increases.

The voltage supply unit 620 increases the voltage level of the second node 'node M'. As the voltage level of the second node 'node M' increases, the voltage level of the first node 'node L' also increases.

If levels of threshold voltages of the first transistor P61 of the voltage supply unit 620 and the second transistor P62 of the first control unit 630 are higher than those designed, the voltage increasing rate of the second node 'node M' is lower than that designed by the first transistor P61. However, the voltage level of the second node 'node M' is higher than that designed by the second transistor P62.

Further, when the threshold voltages of the first transistor P61 and the second transistor P62 are lower than those designed, the voltage increasing rate of the first node 'node L' is higher than that designed by the first transistor P61 and the voltage level of the first node 'node L' is lower than that designed by the second transistor P62.

Therefore, the second node 'node M' may have the voltage level designed regardless of variation in the process of the transistor and the first node 'node L' may also have the voltage level designed.

If the threshold voltages of the third transistor N61 of the voltage dropping unit 640 and the fourth transistor N62 of the second control unit 650 are higher than those designed, the third transistor N61 drops the voltage level of the third node 'node M' at a voltage drop rate lower than a predetermined voltage drop rate as the divided voltage 'V_dv' increases. However, the fourth transistor N62 decreases the voltage level of the third node 'node N' to a voltage level lower than that designed.

In addition, if the threshold voltages of the third transistor N61 and the fourth transistor N62 are lower than those designed, the third transistor N61 drops the voltage level of the third node 'node N' at a voltage drop rate higher than a predetermined voltage drop rate as the divided voltage 'V_dv' increases. The fourth transistor N62 increases the voltage level of the third node 'node N' to a voltage level higher than that designed.

Therefore, the third node 'node N' may have the predetermined voltage level regardless of the variation in the process of the transistor and the second node 'node L' may also have the predetermined voltage level.

The voltage supply unit 620 and the first control unit 630 can control the voltage level and voltage increasing rate of the first node 'node L' depending on the variation in the process and the voltage dropping unit 640 and the second control unit 650 can control the voltage level and voltage drop rate of the first node 'node L' depending on the variation in the process.

As a result, the voltage level of the first node 'node L' may be equal to or lower than a predetermined voltage level at a voltage level of the external voltage VDD designed.

Consequently, since the power-up signal generating circuit 600 of the semiconductor memory apparatus can constantly maintain an enable timing of the power-up signal regardless of the variation in the process, the power-up signal generating circuit 600 can ensure a normal initialization operation of the semiconductor memory apparatus and minimize an initialization operation time.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A power-up signal generating circuit of a semiconductor memory apparatus, comprising:

a voltage supply unit configured to apply a voltage to a first node;

a voltage dropping unit configured to decrease a voltage level of the first node as a level of a divided voltage dividing an external voltage increases;

a control unit configured to control the voltage level of the first node depending on a voltage drop rate of the first node; and a signal generating unit configured to enable a power-up signal depending on the voltage level of the first node.

2. The power-up signal generating circuit of claim 1, wherein the voltage dropping unit includes a first transistor configured to be applied with the divided voltage at a gate thereof and connected to a second node and a ground terminal at a drain and a source thereof, respectively.

3. The power-up signal generating circuit of claim 2, wherein the control unit is configured to increase the voltage level of the first node when the voltage drop rate of the first node is higher than a predetermined voltage drop rate, and decrease the voltage level of the first node when the voltage drop rate of the first node is lower than the predetermined voltage drop rate.

4. The power-up signal generating circuit of claim 3, wherein the control unit comprises:

a resistor configured to be connected between the first node and the second node; and a second transistor configured to be applied with the external voltage at a gate and a drain thereof and connected to the second node at a source thereof.

5. The power-up signal generating circuit of claim 4, wherein the first transistor and the second transistor are transistors of the same type.

6. A power-up signal generating circuit of a semiconductor memory apparatus, comprising:

a voltage supply unit configured to increase a voltage level of a first node;

a control unit configured to control the voltage level of the first node depending on a voltage increasing rate of the first node;

a voltage dropping unit configured to decrease the voltage level of the first node as a level of a divided voltage dividing an external voltage increases; and a signal generating unit configured to enable a power-up signal depending on the voltage level of the first node.

7. The power-up signal generating circuit of claim 6, wherein the voltage supply unit includes a first transistor configured to be connected to a ground terminal at a gate thereof, applied with the external voltage at a source, and connected to a second node at a drain thereof.

8. The power-up signal generating circuit of claim 7, wherein the control unit is configured to decrease the voltage level of the first node when the voltage increasing rate of the first node is higher than a predetermined voltage increasing rate and increase the voltage level of the first node when the voltage increasing rate of the first node is lower than the predetermined voltage increasing rate.

9. The power-up signal generating circuit of claim 8, wherein the control unit comprises:

a resistor configured to be connected between the first node and the second node; and a second transistor configured to be connected to a ground terminal at a gate thereof, connected to the second node at a source thereof, and connected to the ground terminal at a drain thereof.

10. The power-up signal generating circuit of claim 9, wherein the first transistor and the second transistor are transistors of the same type.

11. The power-up signal generating circuit of claim 6, wherein the voltage dropping unit includes a transistor configured to be applied with the divided voltage at a gate thereof, connected to the first node at a drain thereof, and connected to a ground terminal at a source thereof.

12. A power-up signal generating circuit of a semiconductor memory apparatus, comprising:

a voltage supply unit configured to increase a voltage level of a first node;

a first control unit configured to control the voltage level of the first node depending on a voltage increasing rate of the first node;

a voltage dropping unit configured to decrease the voltage level of the first node as a level of a divided voltage dividing an external voltage increases;

a second control unit configured to control the voltage level of the first node depending on a voltage drop rate of the first node; and a signal generating unit configured to enable a power-up signal depending on the voltage level of the first node.

13. The power-up signal generating circuit of claim 12, wherein the voltage supply unit includes a first transistor configured to be connected to a ground terminal at a gate thereof, applied with the external voltage at a source thereof, and connected to a second node at a drain thereof.

14. The power-up signal generating circuit of claim 12, wherein the first control unit is configured to decrease the voltage level of the first node when the voltage increasing rate of the first node is higher than a predetermined voltage increasing rate and increase the voltage level of the first node when the voltage increasing rate of the first node is lower than the predetermined voltage increasing rate.

15. The power-up signal generating circuit of claim 14, wherein the first control unit comprises:

a resistor configured to be connected between the first node and the second node; and a second transistor configured to be connected to the ground terminal at a gate thereof, connected to the second node at a source thereof, and connected to the ground terminal at a drain thereof.

16. The power-up signal generating circuit of claim 13, wherein the first transistor and the second transistor are transistors of the same type.

17. The power-up signal generating circuit of claim 12, wherein the voltage dropping unit includes a first transistor configured to be applied with the divided voltage at a gate thereof, connected to a second node at a drain thereof, and connected to a ground terminal at a source thereof.

18. The power-up signal generating circuit of claim 17, wherein the second control unit is configured to increase the voltage level of the first node when the voltage drop rate of the first node is higher than a predetermined voltage drop rate and decrease the voltage level of the first node when the voltage drop rate of the first node is lower than the predetermined voltage drop rate.

19. The power-up signal generating circuit of claim 18, wherein the second control unit comprises:

a resistor configured to be connected between the first node and the second node; and a second transistor configured to be applied with the external voltage at a gate and a drain thereof and connected to the second node at a source.

20. The power-up signal generating circuit of claim 19, wherein the first transistor and the second transistor are transistors of the same type.

* * * * *